United States Patent
Tsukamoto et al.

(10) Patent No.: US 7,332,862 B2
(45) Date of Patent: Feb. 19, 2008

(54) LED LAMP INCLUDING A RESIST BONDED TO A COPPER FILM

(75) Inventors: Hiroko Tsukamoto, Aichi (JP); Hideki Mori, Aichi (JP); Atsushi Tsuzuki, Aichi (JP); Hisao Yamaguchi, Aichi (JP); Mahito Hamada, Tokyo (JP); Toshimi Kamikawa, Tokyo (JP)

(73) Assignees: Toyoda Gosei Co., Ltd., Nishikasugai-gun, Aichi (JP); Stanley Electric Co., Ltd., Tokyo (JP)

( * ) Notice: Subject to any disclaimer, the term of this patent is extended or adjusted under 35 U.S.C. 154(b) by 166 days.

(21) Appl. No.: 10/822,866

(22) Filed: Apr. 13, 2004

(65) Prior Publication Data

US 2004/0251828 A1   Dec. 16, 2004

(30) Foreign Application Priority Data

Apr. 14, 2003  (JP) .......................... P2003-109279

(51) Int. Cl.
*H01J 63/04* (2006.01)

(52) U.S. Cl. .................. 313/512; 313/504; 313/506; 257/98; 257/99; 257/100

(58) Field of Classification Search ................ 313/512, 313/504, 506; 257/97–100
See application file for complete search history.

(56) References Cited

U.S. PATENT DOCUMENTS

| | | | | |
|---|---|---|---|---|
| 5,298,768 A | * | 3/1994 | Okazaki et al. ............. 257/81 |
| 5,612,512 A | * | 3/1997 | Wakamatsu et al. ........ 174/260 |
| 5,729,437 A | * | 3/1998 | Hashimoto ................ 361/760 |
| 5,962,917 A | * | 10/1999 | Moriyama ................ 257/697 |
| 6,180,962 B1 | * | 1/2001 | Ishinaga ................... 257/99 |
| 6,274,890 B1 | * | 8/2001 | Oshio et al. ............... 257/98 |
| 6,377,292 B1 | * | 4/2002 | Shimizu et al. ............ 347/238 |
| 2002/0024299 A1 | * | 2/2002 | Okazaki .................. 313/512 |

FOREIGN PATENT DOCUMENTS

JP         8-330637        12/1996
JP      2001196641 A    *  7/2001

* cited by examiner

*Primary Examiner*—Joseph Williams
*Assistant Examiner*—Hana Asmat Sanei
(74) *Attorney, Agent, or Firm*—McGinn IP Law Group, PLLC

(57) ABSTRACT

In an LED lamp, a copper film is first formed on a substrate by plating. A resist is then bonded onto the copper film so that shaped like a ring viewed from the whole of the LED lamp. A nickel and a gold film are formed on a portion of the copper film where the resist is not bonded. Next, an adhesive agent is applied onto a bottom of the lamp house so that the lamp house is bonded onto the substrate through the adhesive agent. A transparent epoxy resin is packed in the frame of the lamp house and hardened by heating to perform resin sealing. Since the resist is bonded onto the surface of copper having a large number of fine irregularities sufficient to ensure a large contact area and excellent in adhesion, separation can be prevented from being caused by thermal stress.

26 Claims, 3 Drawing Sheets

US 7,332,862 B2

LED LAMP INCLUDING A RESIST BONDED TO A COPPER FILM

This application is based on Japanese Patent Application No. 2003-109279, which is incorporated herein by reference.

BACKGROUND OF THE INVENTION

1. Field of the Invention

The present invention relates to a light-emitting diode (hereinafter also referred to as "LED") lamp capable of preventing failure in electrical connection between a light-emitting element and a metal pattern of an electrically conducting portion. Particularly, it relates to an LED lamp using a resin frame member such as a lamp house.

Incidentally, in this specification, an LED chip per se is referred to as "light-emitting element". An LED chip packed in a package resin or an LED chip including an optical device such as a lens system is collectively referred to as "light-emitting diode lamp" or "LED lamp".

2. Description of the Related Art

[Patent Document 1] JP-A-8-330637

A surface-mounting type light-emitting diode according to the related art has the following disadvantages. Because a metal pattern (electrically conducting portion) on a substrate is nipped by a seal mold when a resin sealing portion is formed, there is a possibility that the metal pattern may crack. There is also a possibility that the metal pattern and the resin sealing portion may be separated from each other because of a difference in thermal expansion coefficient between the metal pattern and the resin sealing portion in a high temperature process in a solder reflow furnace or the like. Therefore, in an invention disclosed in Patent Document 1, a resist is put between the metal pattern on the substrate and the resin sealing portion. The resist is flexible and acts as a cushioning medium. Accordingly, the flexible resist is deformed to absorb pressure of the seal mold to thereby prevent the metal pattern from cracking. In addition, stress caused by the difference in thermal expansion coefficient between the metal pattern and the resin sealing portion in the high temperature process is absorbed in the resist to thereby prevent the metal pattern and the resin sealing portion from being separated from each other.

A surface of the metal pattern is generally plated with gold because gold is excellent in solder wettability and corrosion protection. The gold-plated surface is however poor in adhesion because it is not rough but smooth. For this reason, even in accordance with the invention disclosed in Patent Document 1, there is a possibility that the separation cannot be prevented sufficiently. Such a case will be described with reference to FIGS. 5A and 5B. FIG. 5A is a vertical sectional view showing a vertical section of an end portion of a related-art LED lamp having a lamp house provided in the periphery of a light-emitting element. FIG. 5B is a vertical sectional view showing a vertical section of an end portion of a related-art LED lamp having a resist layer provided between a lamp house and a metal pattern. Incidentally, the light-emitting element is not shown in each of FIGS. 5A and 5B but is mounted in a central portion of the LED lamp on the left side of each of FIGS. 5A and 5B.

As shown in FIG. 5A, in the LED lamp 20, a metal pattern composed of three layers of copper 14, nickel 15 and gold 16 is formed on a glass epoxy substrate 2 by plating. The reason why the metal pattern is composed of three layers is as follows. Copper 14 is good in adhesion to the glass epoxy substrate 2. Gold 16 is good in solder wettability and excellent in corrosion protection as described above. It is therefore preferable that gold 16 is provided as an outer surface of the metal pattern. Adhesion between copper 14 and gold 16 is however poor. Therefore, nickel 15 excellent in adhesion both to copper 14 and to gold 16 is put between copper 14 and gold 16.

A lamp house 8 made of a white resin is bonded onto the metal pattern by an adhesive agent 7. The lamp house 8 has a taper surface 8a which will serve as a reflecting mirror when the taper surface 8a encircles the light-emitting element. The light-emitting element not shown is then mounted on the surface (gold) 16 of the metal pattern in the central portion of the lamp house 8. After the light-emitting element and the metal pattern are electrically connected to each other by wire bonding, a transparent epoxy resin 9 is packed in the frame of the lamp house 8 and hardened by heating. As a result, the light-emitting element is sealed with the resin. In this manner, the LED lamp 20 is produced.

If the LED lamp 20 is then exposed to a high temperature process in a solder dip or reflow furnace or the like, the metal pattern (14, 15, 16) and the resin portion (7, 8, 9) are however separated from each other because of stress caused by a difference in thermal expansion coefficient between the metal pattern and the resin portion. If the separation comes to the central portion of the LED lamp 20, a product defective in electrical connection/lighting is produced because wires of the light-emitting element sealed with the transparent epoxy resin 9 are separated from the surface (gold) 16 of the metal pattern. Therefore, as shown in FIG. 5B, it may be conceived that a resist 3 is put between the metal pattern and the resin portion in the same manner as in the technique described in Patent Document 1 so that the resist 3 serves as a cushioning medium. Also in this case, the problem in separation caused by thermal stress still remains unsolved because the surface of the metal pattern is made of gold 16 smooth but poor in adhesion and because the resist 3 is made of an epoxy resin.

SUMMARY OF THE INVENTION

An object of the invention is to provide a highly reliable LED lamp in which a copper-resist bonding portion having a surface having a large number of fine irregularities and excellent in adhesion is provided so that separation can be prevented from being caused by thermal stress even in a high temperature process, and a method for manufacturing the LED lamp.

According to the invention, there is provided an LED lamp having: a substrate coated with a metal pattern formed as an electrically conducting portion including films of copper (Cu), nickel (Ni) and gold (Au) laminated successively on the substrate; a resin frame member fixed onto the substrate through an adhesive agent; a light-emitting element fixed into a frame of the resin frame member on the substrate so as to be electrically connected to the metal pattern; a resist bonded onto a nickel-free or gold-free surface of the copper film of the metal pattern to form such a structure that the resist is at least partially put between the substrate and the resin frame member; and a light-transmissive resin packed in the frame of the resin frame member to seal the light-emitting element with the light-transmissive resin.

The reason why the metal pattern as the electrically conducting portion of the light-emitting element is provided as a three-layer structure having films of copper, nickel and gold laminated successively has been described above. The copper film is rather excellent in terms of a bonding surface because the copper film can have a surface having a large number of fine irregularities, that is, the copper film can have a large contact area. Therefore, in accordance with the invention, a portion of the metal pattern onto which the resin frame portion will be bonded is provided as a nickel-free or gold-free copper surface (i.e., a surface of only copper) so that the resist can be bonded onto the copper surface. In order to bond the resist onto the copper surface, the nickel and gold films in the resist bonding portion may be removed from the metal pattern of the three-layer structure, or the resist may be bonded to the copper film in a stage where only the copper film is formed on the substrate before the nickel and gold films are laminated. Then, the resin frame member is bonded to the substrate through an adhesive agent so that the resist is at least partially put between the substrate and the resin frame member. The light-transmissive resin is packed in the frame of the resin frame member and hardened by heating so that the light-emitting element electrically connected to the metal pattern is sealed with the light-transmissive resin.

Even in the case where the LED lamp configured thus is exposed to a high temperature process in a solder dip or reflow furnace or the like, separation can be prevented from being generated from any place because the resist is bonded to the copper surface excellent in adhesion to prevent separation due to stress caused by a difference in thermal expansion coefficient and further because the resist relaxes thermal stress applied to the light-transmissive resin or the resin frame member brought into contact with the resist through the adhesive agent. Accordingly, failure in electrical connection/lighting of the light-emitting element can be prevented.

In this manner, by provision of the copper-resist bonding portion having a surface having a large number of fine irregularities and excellent in adhesion, separation can be prevented from being caused by thermal stress even in a high temperature process. Accordingly, a highly reliable LED lamp can be produced.

According to the invention, there is also provided a method for manufacturing an LED lamp, having the steps of: coating a substrate with a copper film which is provided as a lowermost layer of a metal pattern electrically connected to a light-emitting element; bonding a resist onto the copper film so that the resist encircles the circumference of a position where the light-emitting element will be mounted; forming a nickel film on the copper film and further forming a gold film on the nickel film to thereby complete the metal pattern; bonding a resin frame member onto the substrate through a layer of an adhesive agent so that the resist is at least partially put between the substrate and the resin frame member while the resin frame member encircles the circumference of the position where the light-emitting element will be mounted; mounting the light-emitting element on the metal pattern while electrically connecting the light-emitting element to the metal pattern; and packing a light-transmissive resin in a frame of the resin frame member to seal the light-emitting element with the light-transmissive resin.

As described above, there is not used such a manner that a metal pattern of a three-layer structure is once formed and then nickel and gold films are removed to reveal a surface of a copper film. That is, a resist having a predetermined shape is first bonded to a predetermined position in a stage where only the copper film is formed. Then, nickel and gold films are formed on a portion of the copper film where the resist is not bonded. In this manner, a metal pattern of a three-layer structure is formed. Accordingly, a time-consuming process for removing the nickel and gold films is dispensed with, so that the resist can be easily bonded onto the copper surface excellent in adhesion.

In this manner, the copper-resist bonding portion having a surface having a large number of fine irregularities and excellent in adhesion can be provided easily, so that separation can be prevented from being caused by thermal stress even in a high temperature process. Accordingly, there can be provided a method for easily manufacturing a highly reliable LED lamp.

DETAILED DESCRIPTION OF THE PREFERRED EMBODIMENTS

Figure 1:
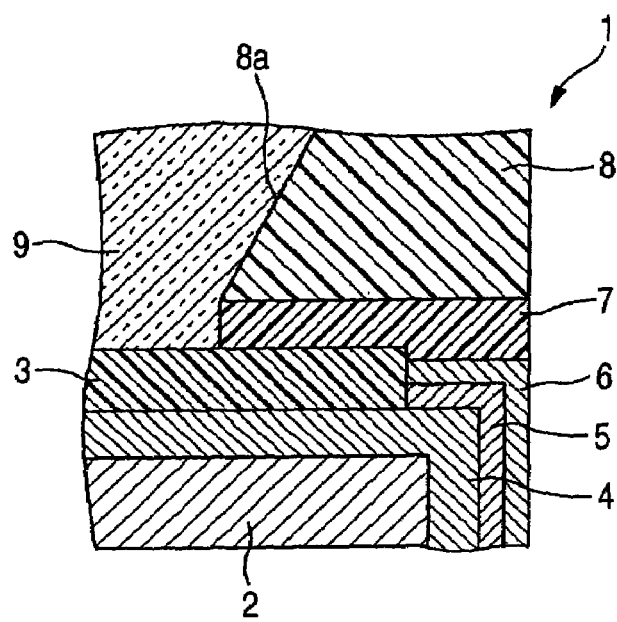
FIG. 1 is a vertical sectional view showing a vertical section of an end portion of an LED lamp according to an embodiment of the invention.
Figure 2:
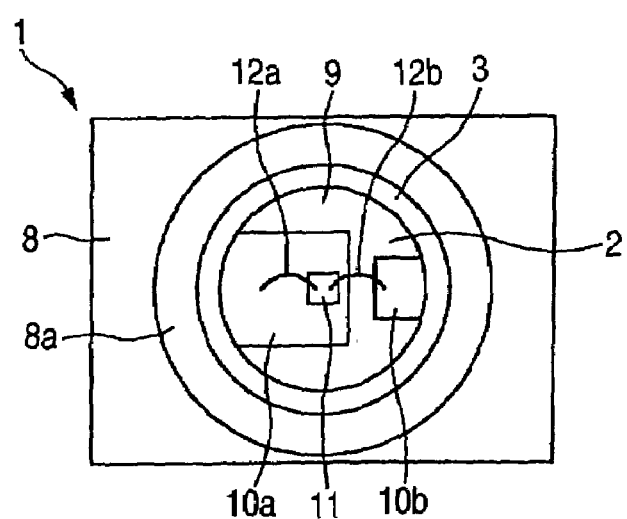
FIG. 2 is a plan view showing an overall configuration of the LED lamp according to the embodiment of the invention.

An LED lamp according to an embodiment of the invention will be described below with reference to FIGS. 1 and 2. FIG. 1 is a vertical sectional view showing a vertical section of an end portion of the LED lamp according to the embodiment of the invention. FIG. 2 is a plan view showing an overall configuration of the LED lamp according to the embodiment of the invention.

FIG. 2 shows, in the LED lamp 1 according to the embodiment, a lamp house 8 is mounted as a resin frame member substantially equal in outer size to a glass epoxy substrate (hereinafter simply referred to as "substrate") 2 provided as a substrate. The lamp house 8 is made of a white nylon resin. A through-hole including a circular taper surface 8a is provided in the center of the lamp house 8. The taper surface 8a serves as a reflecting mirror by which light radiated sideways from a light-emitting element 11 is reflected upward. An inner edge of a resist 3 held between the lamp house 8 and the substrate 2 is visible from the edge of the through-hole of the lamp house 8. Metal pattern parts 10a and 10b each composed of three layers of copper, nickel and gold are formed on the inside of the resist 3 so as to be brought into close contact with the substrate 2.

The blue light-emitting element 11 is fixed onto an end portion of the metal pattern part 10a corresponding to the center of the through-hole of the lamp house 8 while two electrodes of the light-emitting element 11 face upward. The two electrodes are wire-bonded to the metal pattern parts 10a and 10b by gold wires 12a and 12b respectively. A transparent epoxy resin 9 as a light-transmissive resin is packed in the through-hole of the lamp house 8 and hardened by heating, so that the blue light-emitting element 11 is sealed with the resin 9.

An internal structure of the LED lamp 1 having the aforementioned appearance and a method for manufacturing the LED lamp 1 according to the embodiment will be described with reference to FIG. 1. As shown in FIG. 1, a copper film 4 in a metal pattern is formed on the substrate 2 by means of plating. The copper layer 4 is formed continuously up to the lowermost layer of each of the metal pattern parts 10a and 10b. In the related art, a nickel film 5 and a gold film 6 are successively formed on the copper film 4. In the embodiment, a resist 3 is however bonded onto surfaces of the copper film 4 and the substrate 2 so that the resist 3 is shaped like a ring viewed from the whole of the LED lamp 1.

Then, a portion of the copper film 4 (inclusive of the metal pattern parts 10a and 10b) where the resist 3 is not bonded is plated with nickel and then plated with gold to thereby form a nickel film 5 and a gold film 6. By adopting such a manufacturing method, a process of removing the nickel and gold films 5 and 6 is dispensed with, so that the resist 3 can be bonded onto the surface of the copper film 4 easily. Next, an adhesive agent 7 is applied onto a bottom of the lamp house 8 so that the lamp house 8 is bonded onto the substrate 2 through the adhesive agent 7. In this manner, as shown in FIG. 1, the lamp house 8 is bonded onto the resist 3 and the metal pattern (4, 5, 6) crosswise through the adhesive agent 7.

FIG. 2 shows, after the blue light-emitting element 11 is mounted and wire-bonded onto the metal pattern part 10a, a transparent epoxy resin 9 is packed in a frame of the lamp house 8 and hardened by heating, so that the light-emitting element 11 is sealed with the resin 9. In this manner, production of the LED lamp 1 is completed.

Even in the case where the LED lamp 1 having such an internal structure according to the embodiment is exposed to a high temperature process in a solder dip or reflow furnace or the like, the resist 3 can be prevented from being separated due to stress caused by a difference in thermal expansion coefficient because the resist 3 is bonded on the surface of the copper film 4 having a large number of fine irregularities sufficient to ensure a large contact area and excellent in adhesion. In addition, separation can be prevented from being generated from any place because the resist 3 relaxes thermal stress applied onto the transparent epoxy resin 9 or the lamp house 8 brought into contact with the resist 3 through the adhesive agent 7. Accordingly, failure in electrical conduction/lighting of the blue light-emitting element 11 can be prevented.

In this manner, in the LED lamp 1 according to the embodiment, because the copper 4-resist 3 bonding portion having a surface having a large of fine irregularities and excellent in adhesion is provided, separation can be prevented from being generated due to thermal stress even in a high temperature process. Accordingly, a highly reliable LED lamp without any failure in electrical conduction/lighting can be produced.

Figure 3:
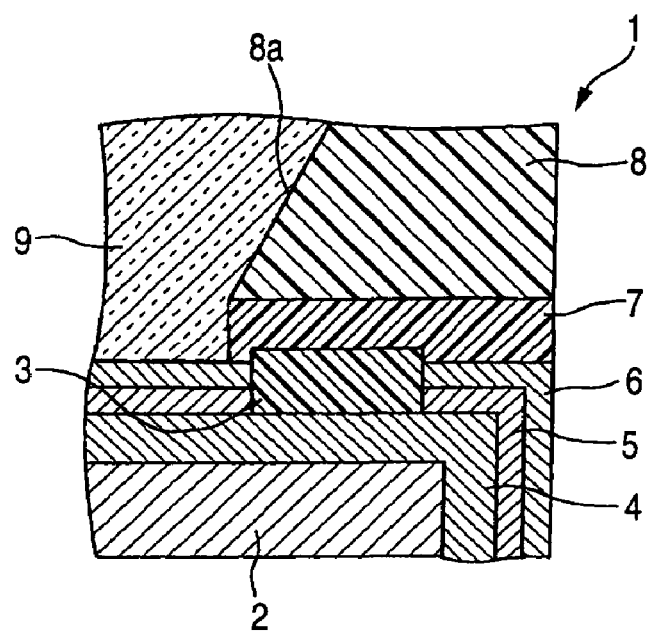
FIG. 3 is a vertical sectional view showing vertical section of an end portion of the LED lamp according to another embodiment of the invention.
Figure 4:
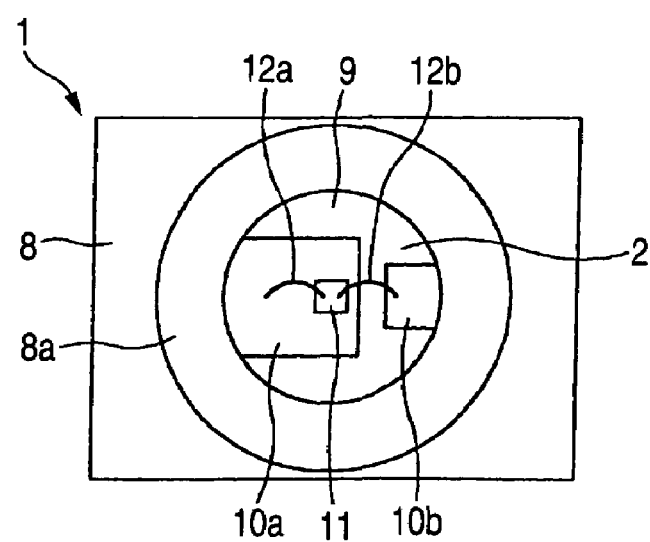
FIG. 4 is a plan view showing an overall configuration of the LED lamp according to another embodiment of the invention.
Figure 5A:
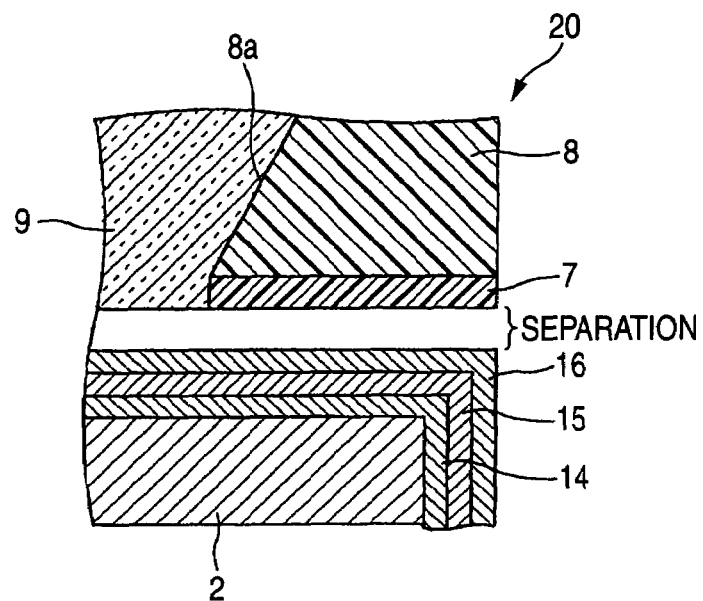
FIG. 5A is a vertical sectional view showing a vertical section of an end portion of an LED lamp having a lamp house provided in the periphery of a light-emitting element according to the related art.
Figure 5B:
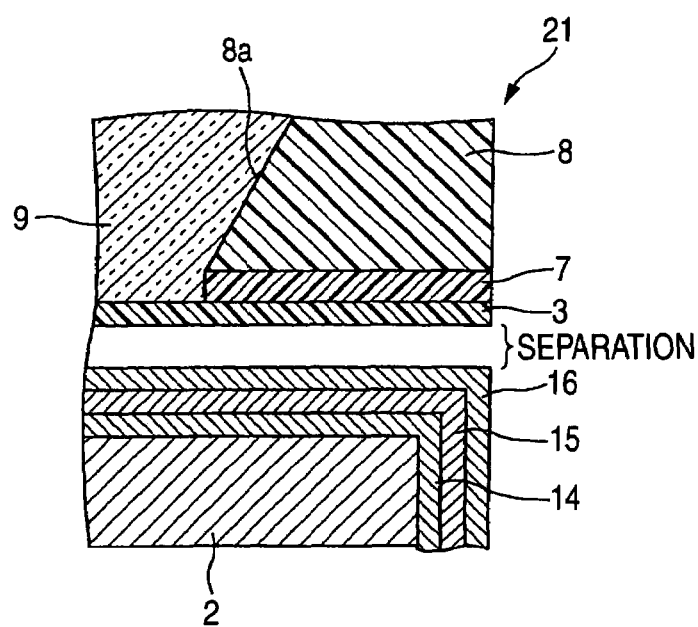
FIG. 5B is a vertical sectional view showing a vertical section of an end portion of an LED lamp having a resist layer provided between a lamp house and a metal pattern according to the related art.

Although the embodiment has been described on the case where a blue light-emitting element 11 used as the light-emitting element is mounted and wire-bonded with its electrodes facing upward, the invention may be applied to the case where a light-emitting element with an emission color such as red, green, amber, or the like, is used as the light-emitting element, or electrical connection of a flip chip structure is used while electrodes of the light-emitting element face downward. It is also possible to wholly put the resist 3 between the substrate 2 and the resin frame member 3 as shown in FIGS. 3 and 4.

Although the embodiment has been described on the case where a transparent epoxy resin is used as the light-transmissive resin, any other transparent resin such as a transparent silicone resin may be used as long as the transparent resin is excellent in fluidity before thermal hardening and in transparency after thermal hardening and has a thermal expansion coefficient not largely different from that of the transparent epoxy resin.

In order to carry out the invention, other parts concerning the LED lamp per se, that is, the configuration, shape, quantity, material, size, connection relation, etc. of the LED lamp are not limited to the embodiment, and other processes used in the method for manufacturing the LED lamp are not limited to the embodiment, either.

As described above, according to the invention, there is provided an LED lamp having: a substrate coated with a metal pattern formed as an electrically conducting portion including films of copper (Cu), nickel (Ni) and gold (Au) laminated successively on the substrate; a resin frame member fixed onto the substrate through an adhesive agent; a light-emitting element fixed into a frame of the resin frame member on the substrate so as to be electrically connected to the metal pattern; a resist bonded onto a nickel-free or gold-free surface of the copper film of the metal pattern to form such a structure that the resist is at least partially put between the substrate and the resin frame member; and a light-transmissive resin packed in the frame of the resin frame member to seal the light-emitting element with the light-transmissive resin.

As described above, a portion of the metal pattern on which the resin frame member will be bonded is provided as a nickel-free or gold-free copper surface (i.e., a surface of only copper) so that the resist can be bonded onto the copper surface. The resin frame member is then bonded onto the substrate through an adhesive agent so that the resist is at least partially held between the substrate and the resin frame member. The light-transmissive resin is packed in the frame of the resin frame member and hardened by heating, so that the light-emitting element electrically connected to the metal pattern is sealed with the light-transmissive resin.

Even in the case where the LED lamp configured thus is exposed to a high temperature process in a solder dip or reflow furnace or the like, separation can be prevented from being generated from any place because the resist is bonded to the copper surface excellent in adhesion to prevent separation due to stress caused by a difference in thermal expansion coefficient and further because the resist relaxes thermal stress applied onto the light-transmissive resin or the resin frame member brought into contact with the resist through the adhesive agent. Accordingly, failure in electrical connection/lighting of the light-emitting element can be prevented.

In this manner, by provision of the copper-resist bonding portion having a surface having a large number of fine irregularities and excellent in adhesion, separation can be prevented from being caused by thermal stress even in a high temperature process, so that a highly reliable LED lamp can be produced.

According to the invention, there is also provided a method for manufacturing an LED lamp, having the steps of: coating a substrate with a copper film which is provided as a lowermost layer of a metal pattern electrically connected to a light-emitting element; bonding a resist onto the copper film so that the resist encircles the circumference of a position where the light-emitting element will be mounted;

forming a nickel film on the copper film and further forming a gold film on the nickel film to thereby complete the metal pattern; bonding a resin frame member onto the substrate through a layer of an adhesive agent so that the resist is at least partially put between the substrate and the resin frame member while the resin frame member encircles the circumference of the position where the light-emitting element will be mounted; mounting the light-emitting element on the metal pattern while electrically connecting the light-emitting element to the metal pattern; and packing a light-transmissive resin in a frame of the resin frame member to seal the light-emitting element with the light-transmissive resin.

As described above, there is not used such a manner that a metal pattern of a three-layer structure is once formed and then nickel and gold films are removed to reveal a surface of a copper film. That is, a resist having a predetermined shape is first bonded to a predetermined position in a stage where only the copper film is formed. Then, nickel and gold films are formed on a portion of the copper film where the resist is not bonded. In this manner, a metal pattern of a three-layer structure is formed. Accordingly, a time-consuming process for removing the nickel and gold films is dispensed with, so that the resist can be easily bonded onto the copper surface excellent in adhesion.

In this manner, the copper-resist bonding portion having a surface having a large number of fine irregularities and excellent in adhesion can be provided easily, so that separation can be prevented from being caused by thermal stress even in a high temperature process. Accordingly, there can be provided a method for easily manufacturing a highly reliable LED lamp.

What is claimed is:

1. A light-emitting diode (LED) lamp comprising:
   a substrate coated with a metal pattern formed as an electrically conducting portion including films of copper (Cu), nickel (Ni) and gold (Au) laminated successively in this order on the substrate;
   a resin frame member fixed onto the substrate through an adhesive agent;
   a light-emitting element fixed into a frame of the resin frame member on the substrate so as to be electrically connected to the metal pattern;
   a resist bonded onto a nickel-free or gold-free surface of the copper film of the metal pattern to form such a structure that the resist is at least partially formed between the substrate and the resin frame member; and
   a light-transmissive resin packed in the frame of the resin frame member to seal the light-emitting element with the light-transmissive resin.

2. An LED lamp according to claim 1, wherein an inner edge of the resist held between the resin frame member and the substrate is visible from the edge of the through-hole of the resin frame member.

3. An LED lamp according to claim 1, wherein the resist comprises a ring shape.

4. An LED lamp according to claim 1, wherein said resin frame member comprises a nylon resin.

5. An LED lamp according to claim 1, wherein said resist comprises a resist for adhering said resin frame member to said metal pattern.

6. An LED lamp according to claim 1, wherein an inner surface of said resin frame member comprises a reflective surface for reflecting light emitted from said light-emitting element.

7. An LED lamp according to claim 1, wherein said light-emitting element comprises an electrode tat is wire bonded to said metal pattern.

8. An LED lamp according to claim 1, wherein said light-transmissive resin comprises an epoxy resin.

9. An LED lamp according to claim 1, wherein said adhesive agent is formed on said resist and said metal pattern.

10. An LED lamp according to claim 1, wherein said resin frame member is bonded to said resist and said metal pattern via said adhesive agent.

11. An LED lamp according to claim 1, wherein said surface of said copper film comprises irregularities for increasing a contact area between said resist and said surface of said copper film.

12. An LED lamp according to claim 1, wherein said light-emitting element comprises a flip-chip type light emitting element.

13. A light-emitting diode (LED) lamp comprising:
    a metal pattern formed on a substrate and comprising a copper layer and a nickel layer formed on a surface of said copper layer;
    a resist layer directly bonded to said surface of said copper layer;
    a light-emitting element formed on said substrate and electrically connected to said metal pattern; and
    a frame member formed outside said light-emitting element, at least a portion of said frame member being formed on said resist layer.

14. An LED lamp according to claim 13, wherein said metal pattern further comprises a gold layer formed on said nickel layer.

15. An LED lamp according to claim 14, wherein said gold layer and said nickel layer are formed on a side surface of said resist layer.

16. An LED lamp according to claim 13, wherein at least a portion of said resist layer is formed between said substrate and said frame member.

17. An LED lamp according to claim 13, further comprising:
    a light-transmissive resin formed on said substrate and scaling said light-emitting element.

18. An LED lamp according to claim 13, further comprising:
    an adhesive layer formed between said resist layer and said frame member.

19. An LED lamp according to claim 13, wherein said copper layer comprises a lowermost layer of said metal pattern.

20. A lamp structure for a light-emitting element, said lamp structure comprising:
    a substrate on which said light-emitting element is mounted;
    a metal pattern formed on said substrate and comprising a copper layer and a nickel layer formed on a surface of said copper layer;
    a resist layer directly bonded to said surface of said copper layer; and
    a frame member formed outside said light-emitting element, at least a portion of said frame member being formed on said resist layer.

21. An LED lamp according to claim 13, wherein said resist layer reaches other than an exterior side surface of the frame member.

22. A lamp structure according to claim 20, wherein said resist layer reaches other than an exterior side surface of the frame member.

23. An LED lamp according to claim 13, wherein at least a portion of said frame member is formed on said nickel layer of said metal pattern.

24. A light-emitting diode (LED) lamp comprising:

a metal pattern formed on a substrate and comprising a copper layer and a plating layer laminated on a surface of said copper layer;

a resist layer directly bonded to said surface of said copper layer;

a light-emitting element formed on said substrate and electrically connected to said metal pattern; and a frame member formed outside said light-emitting element, at least a portion of said frame member being formed on said resist layer.

25. The light-emitting diode (LED) lamp according to claim 24, wherein an uppermost layer of the laminated plating layer comprises a metal having a solder wettability that is greater than a solder wettability of copper.

26. The light-emitting diode (LED) lamp according to claim 25, wherein said metal having a solder wettability that is greater than a solder wettability of copper comprises gold.

* * * * *